(12) United States Patent
Shigemi et al.

(10) Patent No.: US 6,350,334 B1
(45) Date of Patent: Feb. 26, 2002

(54) METHOD OF MANUFACTURING A MULTI-LAYERED CERAMIC SUBSTRATE

(75) Inventors: Jun Shigemi, Saijo; Shigetoshi Segawa, Niihama, both of (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/555,009

(22) PCT Filed: Nov. 1, 1999

(86) PCT No.: PCT/JP99/06072

§ 371 Date: Jul. 19, 2000

§ 102(e) Date: Jul. 19, 2000

(87) PCT Pub. No.: WO00/26957

PCT Pub. Date: May 11, 2000

(30) Foreign Application Priority Data

Nov. 2, 1998 (JP) ............................................. 10-312528

(51) Int. Cl.[7] .................... B32B 31/18; B32B 31/12; B32B 31/26; H01L 21/98
(52) U.S. Cl. ................... 156/89.12; 156/89.16; 156/250; 156/253; 156/272.8; 156/289; 29/851
(58) Field of Search .................. 156/89.12, 89.16, 156/250, 253, 267, 272.8, 289, 277; 29/851; 264/614, 619

(56) References Cited

U.S. PATENT DOCUMENTS

| | | | |
|---|---|---|---|
| 5,176,771 A | * | 1/1993 | Bravo et al. |
| 5,250,130 A | * | 10/1993 | Enloe et al. ............ 156/289 X |
| 5,435,875 A | * | 7/1995 | Saitoh et al. |
| 5,601,673 A | * | 2/1997 | Alexander |
| 5,772,837 A | * | 6/1998 | Natarajan et al. |
| 5,785,800 A | * | 7/1998 | Natarajan et al. |
| 5,788,808 A | * | 8/1998 | Natarajan et al. |
| 5,800,761 A | | 9/1998 | Casey et al. |
| 5,846,361 A | * | 12/1998 | Fasano et al. ....... 156/89.12 X |
| 5,858,145 A | * | 1/1999 | Sreeram et al. ...... 156/89.12 X |
| 5,885,803 A | * | 1/1999 | Bailey et al. |
| 5,972,140 A | * | 10/1999 | Hass et al. ............. 156/289 X |

FOREIGN PATENT DOCUMENTS

| | | |
|---|---|---|
| EP | 0 695 631 | 2/1996 |
| JP | 9-266264 | * 10/1997 |
| WO | 98/16383 | 4/1998 |

* cited by examiner

Primary Examiner—Curtis Mayes
(74) Attorney, Agent, or Firm—Parkhurst & Wendel, L.L.P

(57) ABSTRACT

A method of manufacturing a multi-layered ceramic substrate which does not require dies for making cavities, or aligning the green sheets. The method includes the steps of providing a plurality of green sheets having pre-fabricated via holes and wiring patterns therein; forming a layer for preventing sintering of adjacent green sheets at an area to become the bottom of the cavity; laminating and sintering the green sheets to create a multi-layered sintered body; and making a cut along the inner wall of the cavity all the way to the bottom of the cavity and removing the inside sintered portion leaving the formed cavity. This method eliminates the need for expensive dies, thus providing a simple, stable, and inexpensive manufacturing method for a multi-layered ceramic substrate.

8 Claims, 3 Drawing Sheets

METHOD OF MANUFACTURING A MULTI-LAYERED CERAMIC SUBSTRATE

The present invention relates to methods of manufacturing a multi-layered ceramic substrate having cavities such as IC chip embedding holes.

BACKGROUND OF THE INVENTION

Multi-layered ceramic substrates (hereafter referred to as MLCs) are employed in a wide range of electronic devices requiring smaller size and higher performance. MLCs are manufactured by laminating multiple green sheets with pre-fabricated via holes and wiring patterns to create a laminated body, and then sintering this laminated body.

MLCs are made thinner by embedding IC chips such as flip chips in cavities created in the substrate. Blind holes and through holes may also be provided in the substrate in accordance with mounting requirements.

In a conventional method for creating cavities in MLCs, a part of a green sheet on which a cavity is to be created is first punched using dies to form the required holes. Accordingly, press dies may need to be re-fabricated every time specifications for cavities are changed, increasing die cost. In addition, for creating cavities extending through more than one green sheet, the hole in each green sheet needs to be aligned before lamination. For this purpose, a different die for aligning needs to be prepared to accurately align the positions of the holes. This raises manufacturing costs as well as adding to the number of manufacturing steps.

Furthermore, even though such jigs are employed, holes cannot be positioned with high accuracy, making the conventional method difficult to apply to recent high-density wiring. In other words, conventional technology is being overtaken by the recent trend towards extremely fine wiring patterns.

On the other hand, to assure dimensional accuracy, since the dimensions of ordinary MLCs change as a result of shrinkage that occurs during sintering, the use of non-shrinkable ceramic substrates is becoming more common. For creating cavities in a non-shrinkable ceramic substrates, a laminated body of green sheets needs to be sandwiched by a material that does not sinter at the sintering temperature of the substrate. The bottoms of cavities also needs to be covered with a material that does not sinter at the sintering temperature of the substrate. However, there is no simple method for accurately applying a non-sintering material at the bottom of a cavity, making the creation of cavities in non-shrinkable ceramic substrate problematic.

The present invention aims to provide a method of manufacturing MLCs which does not require expensive dies or hole aligning processes.

DISCLOSURE OF THE INVENTION

In the present invention, a sintering preventive process is applied to a part of a green sheet which will become the bottom of a cavity in a MLC to prevent sintering of adjacent green sheets. Then, the inner wall of the cavity is cut all the way to the bottom of the cavity, and the inside sintered portion of the cavity is removed. This facilitates the formation of the cavity. Accordingly, the present invention enables rapid creation of a cavity even where a cavity extends through several green sheets, without using expensive dies.

More specifically, the method for manufacturing MLCs of the present invention comprises the following steps.

i) A plurality of green sheets having pre-fabricated via holes and wiring patterns are laminated to create a laminated body;

ii) The laminated body is sintered to create a multi-layered sintered body wherein the laminated body contains a green sheet in which a cavity is formed, and a sintering preventive materials is applied between adjacent green sheets in an area which will become the bottom of the cavity; and iii) The inner wall of a cavity is cut all the way to the bottom of the cavity, and then a sintered portion is removed leaving the cavity.

DESCRIPTION OF THE PREFERRED EMBODIMENTS

Figure 1:
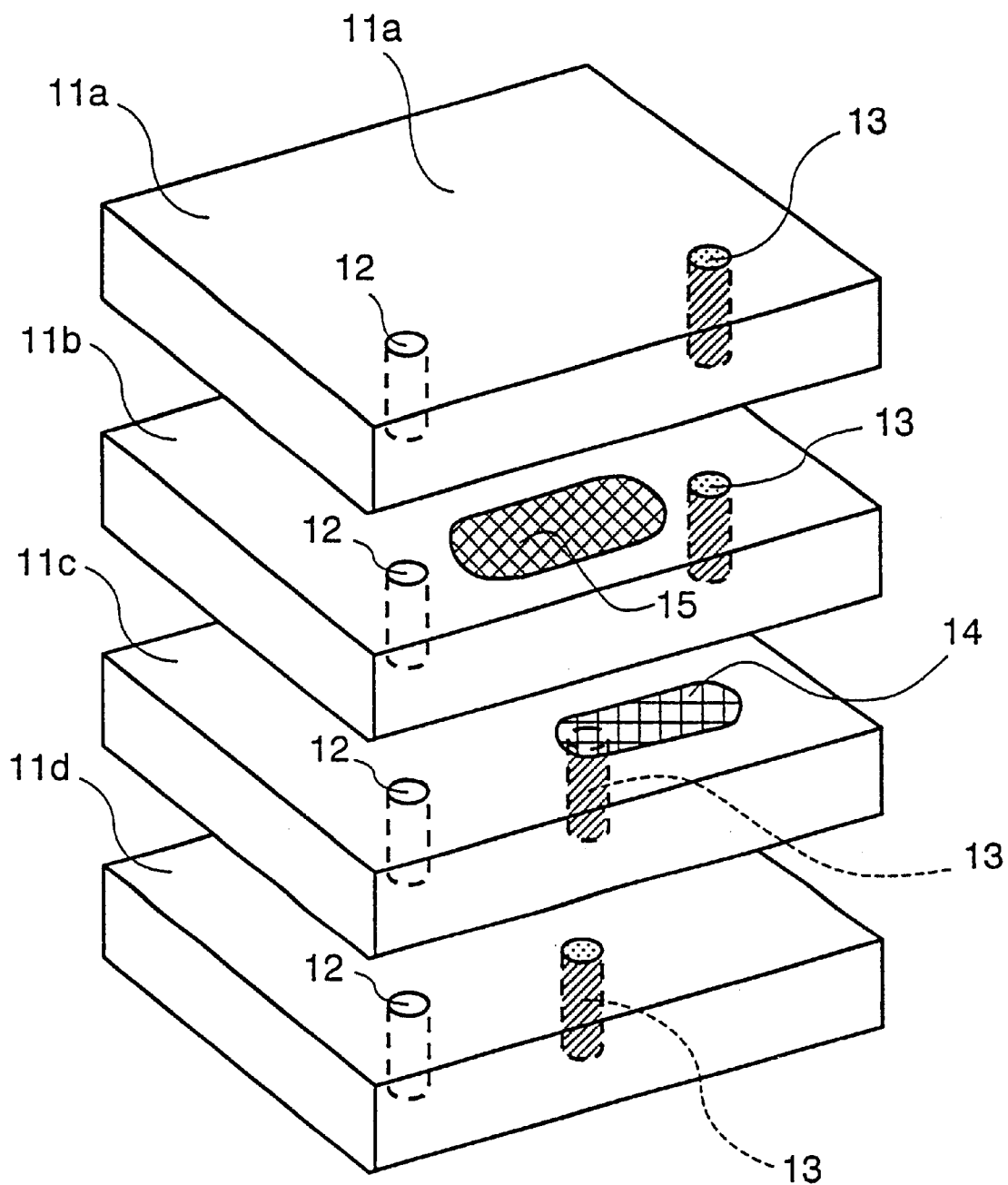
FIG. 1 is a perspective view of a step of forming a via hole in a green sheet in accordance with an exemplary embodiment of the present invention.

An exemplary embodiment of the present invention is described next in a sequence of manufacturing steps.

In a first step, an insulating green sheet (hereafter referred to as a green sheet) is manufactured.

The green sheet employed in the present invention may be manufactured by a conventional method. For example, low-temperature sintering ceramic materials that can be sintered at 1,000° C. or below may be used.

For example, a slurry made by kneading mixed powder containing 45 to 60 wt. % of glass powder such as a $CaO$—$Al_2O_3$—$SiO_2$—$B_2O_3$ composition with a mean particle size of from 0.5 to 1.5 $\mu$m and 55 to 40 wt. % of alumina powder with a mean particle size of from 1.0 to 2.0 $\mu$m, with a vehicle comprising a binder, a plasticizer, and solvent, may be used.

Any of a variety of solvent soluble resins such as cellulose resin, polyvinyl butylal resin, poly-methyl methacrylate resin, or water soluble polyvinyl alcohol resin may be used as the binder.

Phthalic acid ester such as di-butyl phthalate, phosphoric acid ester, or other general plasticizers may be used as the plasticizer.

Solvents which quickly evaporate, such as toluene and methyl ethyl ketone, and those which slowly evaporate, such as cellosolve and its derivatives, carbitol and its derivatives, or benzyl alcohol, may be used as a solvent. The solvent is selected in accordance with manufacturing conditions of a green sheet.

The slurry prepared as above is formed as a sheet typically by using a doctor blade method, and then the sheet is dried to a resultant 0.1 to 0.3 mm thick green sheet.

In a second step, via holes and wiring patterns are formed on the green sheet. An important characteristic of the present invention is to apply sintering preventive treatment to some parts on the green sheet in this step. Via holes and wiring patterns are created, and sintering preventive materials are applied by continuous printing onto this green sheet.

Other methods include printing of the pattern after cutting the green sheet into pieces of about 100–250 mm× about 100–250 mm. In case of continuous printing, the green sheet is cut after forming patterns. Patterns also may be formed by transfer printing, inkjet printing, and spraying.

In a third step, an internal circuit is created on the green sheet, laminated, pressed, and sintered at a high temperature, e.g. 880 to 950° C., for a short period,e.g. 5 to 15 minutes, as in conventional MLC manufacturing methods, to obtain a multi-layered sintered body. A cavity is then created in this multi-layered sintered body, typically by using a laser beam to complete the manufacture of MLCs having cavities. Details of the second and third steps above are described below.

Second Step

Via holes are created in a green sheet as in the conventional manufacturing method. For example, via holes are punched out using punching dies or punching machines, and these punched via holes are then filled with conductive paste for interstitial via holes.

Next, conductive paste for wiring is screen printed on inner layer green sheets or surface layer green sheets of the substrate to form a wiring pattern as in a conventional method.

Figure 3A:
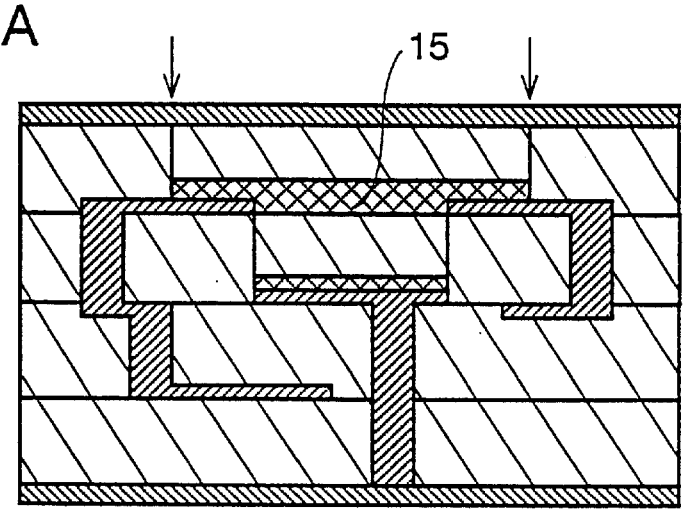
FIGS. 3A–3B are sectional views illustrating forming another type of cavity in accordance with the exemplary embodiment of the present invention.
Figure 3B:
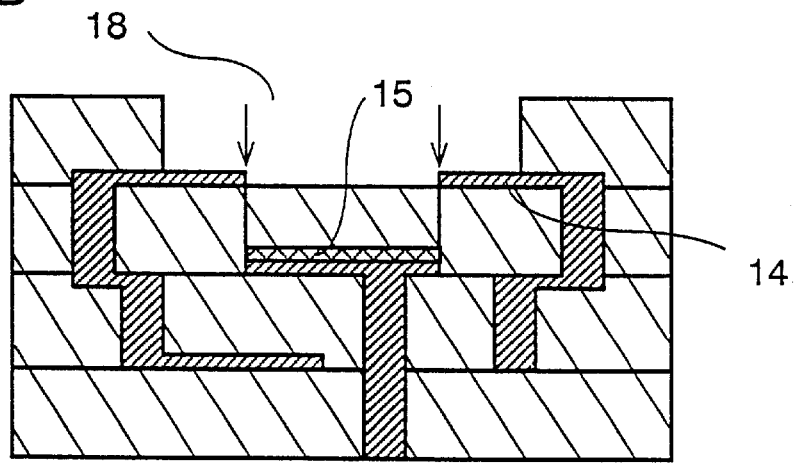
Figure 3C:
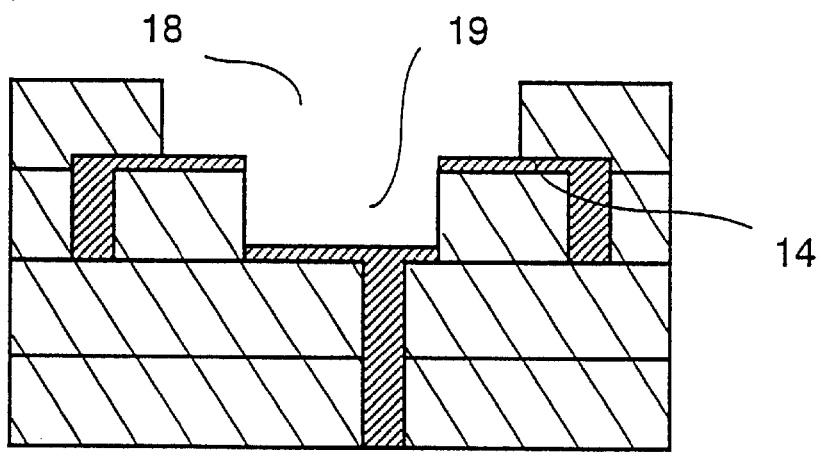

In the present invention, the sintering preventive paste is further printed on the area which will become the bottom of a cavity, to prevent sintering. Here, if the cavity in each layer has the same shape, the sintering preventive paste is printed only on the bottom cavity layer. If a cavity has a stepped structure that makes it progressively smaller layer by layer, or set of layers, as shown in FIG. 3, the sintering preventive paste is also printed on the surface of a green sheet layer which provides the bottom for the upper cavity(s) having larger hole size. This is because cavities are created step by step, by removing a portion of upper layers.

As for conductive paste for wiring patterns on internal layers and surface layers, and conductive paste for interstitial via holes, paste consisting mainly of Ag, Cu, and Au may be used. Since such conductive paste sinters at a temperature lower than 1000° C., it can be sintered together with the aforementioned ceramic green sheets.

The above sintering preventive treatment is applied to the position on the green sheet which will be the bottom of the cavity. As long as sintering of adjacent green sheets is preventable, any workable method may be employed as a sintering preventive treatment, without being limited to the printing of sintering preventive paste. In general, however, it may be most convenient and preferable to employ the sintering preventive paste printing method, which is to apply paste containing dispersed ceramic material with a sintering temperature higher than that of the green sheet, e.g., 900° C., to the green sheet.

One example of a ceramic used in such sintering preventive ceramic paste is $Al_2O_3$ (alumina). Other than alumina, ceramics with high melting points including metal carbides such as SiC, $B_4C$, and TiC, and metal nitrides such as $Si_3N_4$, BN, and TiN, may be used.

Furthermore, if the green sheets are sintered in a neutral or reducing atmosphere, carbon materials such as carbon or graphite may be used. The sintering preventive paste may be prepared in the same way as the slurry for the green sheet. Since the components of the sintering preventive paste have a higher sintering temperature than that of the green sheets, the areas of the adjacent green sheets to which this paste is applied do not sinter.

Consequently, cavities can be created by removing the inside portions of the sintered body at the third step , because adjacent green sheets remain unsintered.

Third Step

In the third step, the green sheets are laminated and sintered into a multi-layered substrate.

First, the green sheets are laminated, and the laminated body is heat pressed to integrate the green sheets. The heat pressing conditions for manufacturing the laminated body do not need to be precisely defined, but a temperature between about 60 and about 120° C., and a pressure between about 50 and about 300 kg/cm² are preferable. The laminated body is then sintered at a high temperature to obtain the multi-layered sintered body.

A characteristic of the present invention is to create cavities in this multi-layered sintered body.

As for the cavity creation method, as long as the inner wall of the cavity is cut all the way to the bottom and the sintered body in the cavity is taken out, there are no particular limitations on the method to be employed.

Useful cutting methods include perforation, slitting using dies, laser-cutting, and the use of press plates as disclosed in Japanese Laid-open Patent Publication No. H7-7269. The laser-cutting method appears to be most preferable.

The cavity to be created may have either a single-layer structure or a multi-layers structure. As shown in FIG. 3, if the cavity diameter becomes smaller in the lower layers, in case of multi-step structures, a cavity is created from the upper layer by removing the portion of that layer within the upper cavity and, then, the portion of the layer (s) with the lower portion of the cavity is removed.

Exemplary Embodiment

Details of an exemplary embodiment of the present invention are described with reference to FIGS. 1–3.

Manufacturing an Green Sheet

A slurry is made by adding 12 parts by weight(hereinafter parts) of poly-methyl methacrylate resin, 5 parts of di-butyl phthalate, and 50 parts of methyl ethyl ketone to 100 parts of mixed powder containing 45 parts of $CaO—Al_2O_3—SiO_2—B_2O_3$ glass powder with a mean particle size of 1.0 μm and 55 wt. % of alumina powder with a mean particle size of 1.5 μm , and kneading the mixture. This slurry is applied on a PET film using a doctor blade, and then dried to complete a 0.2 mm thick green sheet.

Preparing Conductivre Paste for Wiring and Interstitial Via Holes

Conductive paste is prepared by blending and kneading 10 parts of 10% ethyl cellulose terpineol solution with 90 parts of Ag powder with a mean particle size of 6 μm.

Preparing Sintering Preventive Paste

The sintering preventive paste is prepared by blending 10 parts of 10% ethyl cellulose terpineol solution with 90 parts of alumina powder with a mean particle size of 1.5 μm.

Forming Via Holes

Using 0.2 mm diameter punching dies, predetermined points on green sheets 11a to 11d, shown in FIG. 1, are punched to create via holes 12. These via holes 12 are then filled with the conductive paste for via holes 13 by screen printing. To more fully fill the via holes 12 with conductive paste 13, can be suctioned in from the bottom.

Printing Wiring Pattern

As shown in FIG. 1, conductive paste for wiring 14 Is screen printed at predetermined areas on the green sheet 11c.

Printing Sintering Preventive Paste

As shown in FIG. 1, sintering preventive paste 15 was screen printed on a predetermined position on the green sheet 11b.

Laminating Green Sheets

Figure 2A:
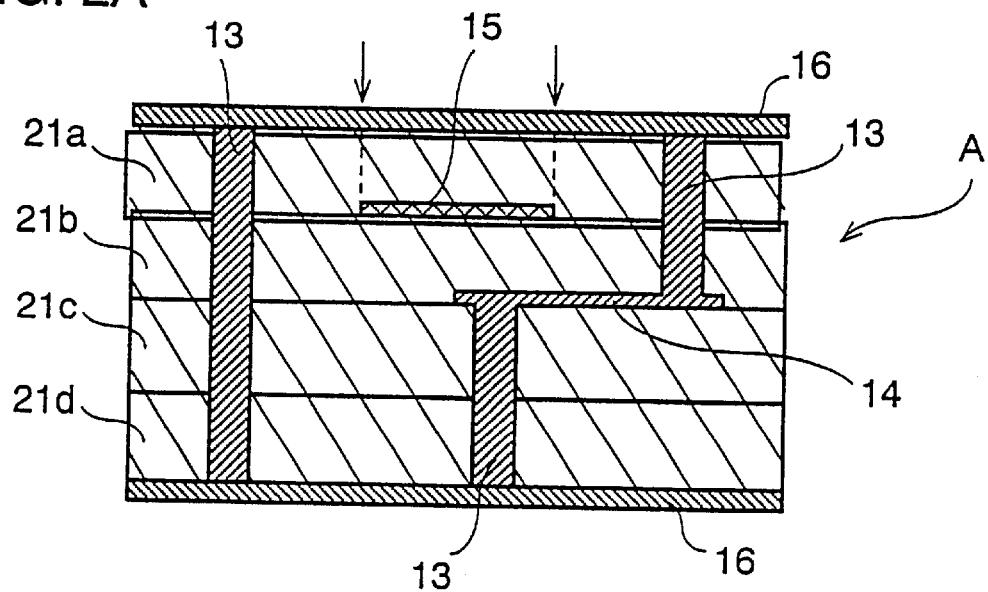
FIG. 2A is a sectional view illustrating applying a laser beam to a multi-layered sintered body obtained by laminating and sintering green sheets in accordance with the exemplary embodiment of the present invention.

Paying attention not to mis-align the green sheets 11a to 11d, they are laminated as shown in FIG. 2A. By lamination, the paste 13 on each of adjacent green sheets is integrated. To prevent mis-alignment among laminating layers, aligning by pattern recognition or pin aligning may be preferable. In this exemplary embodiment, the green sheets 11a to 11d comprised non-shrinkable ceramic materials. Accordingly, an alumina sheet 16 is applied at the top and bottom of a green sheet laminated body A to prevent shrinking of the substrate. The green sheets are laminated at 100° C. and 100 kg/cm$^2$. Finally, the laminated body is completed.

Sintering

Figure 2B:
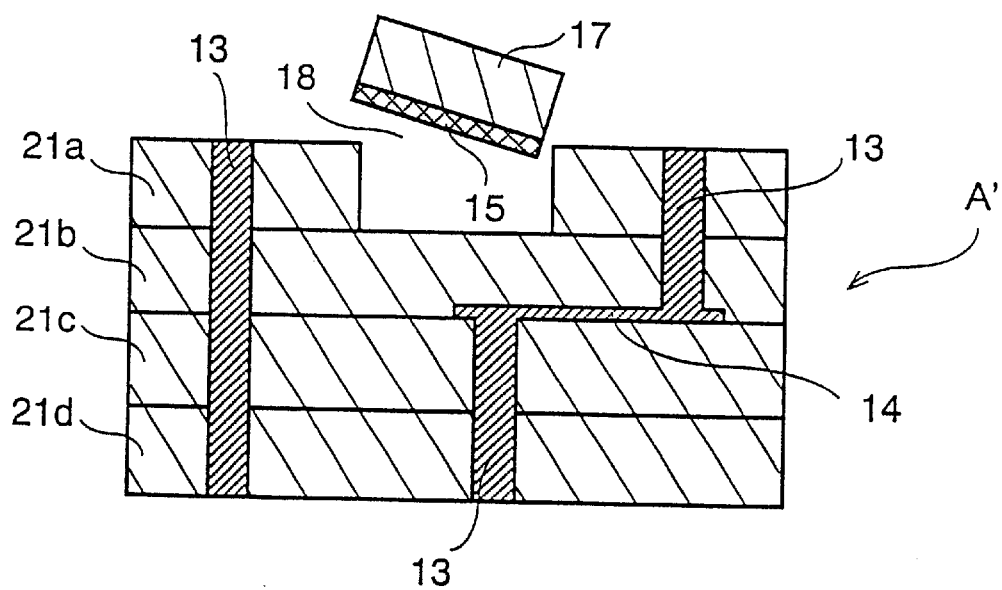
FIG. 2B is a sectional view illustrating creating a cavity in the multi-layered sintered body in accordance with the exemplary embodiment of the present invention.

The binder of the laminated body is burned out at 400° C. for 2 hours, and then the laminated body is sintered at 900° C. for 10 minutes to create a multi-layered sintered body. In FIGS. 2A and 2B, sintered layers 21a to 21d correspond to the green sheets 11a to 11d. The alumina sheets 16 on the top and bottom faces of the multi-layered sintered body, which are not sintered, are removed using a liquid honing machine.

Creating Cavities

A laser beam irradiates the surface of the multi-layered sintered body as shown by the arrows in FIG. 2A, to create a cavity shown by the dotted line in FIG. 2A, in the sintered layer 21a. Then, as shown in FIG. 2B, a cavity 18 is created in the multi-layered sintered body by removing a sintered portion 17.

Since the sintering preventive paste 15 with high sintering temperature is applied between the sintered layers 21a and 21b in the multi-layered sintered body A' at an area which will become the bottom of the cavity 18, the sintered portion 17 is easily removable. The remaining sintering preventive materials on the bottom of the cavity 18 are removed by a liquid honing machine.

MLCs having cavities are thus easily manufactured using the above steps.

Furthermore, an MLC having a stepped cavity, as shown in FIG. 3, is manufactured using the same steps. In this case, a cavity 18 in the uppermost layer is first created after sintering the substrate. A laser beam is applied again to cut out the inner wall of the cavity 19, and then a second-step cavity 19 is created. By forming conductive wiring on the bottom of the cavity 18, an IC chip can be mounted thereon face down. A ceramic substrate with a finer wiring pattern than a normal MLC may also be embedded in a cavity area, and electrically connected, to further increase the wiring density of the entire substrate.

INDUSTRIAL APPLICABILITY

With the use of the method for manufacturing MLCs of the present invention, expensive dies are not required for creating cavities in MLCs. In addition, cavities can be easily created even when a cavity penetrates several green sheets or has a stepped structure. Accordingly, the present invention provides a simple, reliable, and inexpensive method for manufacturing MLCs.

What is claimed is:

1. A method for manufacturing a multi-layered ceramic substrate, comprising providing a plurality of green sheets and forming at least one of a via hole and wiring pattern on one or more of said green sheets;

forming a layer for preventing sintering on one or more of said green sheets at an area where a cavity is to be created;

laminating and sintering said green sheets having a via hole and/or wiring pattern and sintering preventing layer thereon, to form a multi-layered sintered ceramic substrate; and making a cut in at least one layer of the sintered substrate around a predetermined area corresponding to the area of said layer for preventing sintering, and removing a portion of said substrate surrounded by said cut, thereby leaving a cavity in said substrate.

2. The method for manufacturing a multi-layered ceramic substrate as defined in claim 1, wherein said layer for preventing sintering is formed on an area which will become the bottom of the cavity.

3. The method for manufacturing a multi-layered ceramic substrate as defined in claim 1, wherein said step of making a cut and removing a portion of the substrate surrounded by said cut is executed more than once.

4. The method for manufacturing a multi-layered ceramic substrate as defined in claim 1, wherein said cut is made using a laser beam.

5. The method for manufacturing a multi-layered ceramic substrate as defined in claim 1, wherein said cut is made by a method selected from the group consisting of:

perforation;

slitting using dies; and press plate pressing.

6. The method for manufacturing a multi-layered ceramic substrate as defined in claim 1, wherein said step of forming a layer for preventing sintering comprises printing or coating paste containing ceramics which do not sinter at a sintering temperature of said multi-layered ceramic substrate.

7. The method for manufacturing a multi-layered ceramic substrate as defined in claim 1, wherein said step of forming a layer for preventing sintering comprises applying a carbon paste or a graphite paste.

8. The method for manufacturing a multi-layered ceramic substrate as defined in claim 1, wherein said cavity has steps therein.

* * * * *